(12) United States Patent
Chien

(10) Patent No.: US 7,590,387 B2
(45) Date of Patent: Sep. 15, 2009

(54) HIGH ACCURACY VOLTAGE CONTROLLED OSCILLATOR (VCO) CENTER FREQUENCY CALIBRATION CIRCUIT

(75) Inventor: Hung-Ming Chien, Irvine, CA (US)

(73) Assignee: Broadcom Corp.

( * ) Notice: Subject to any disclaimer, the term of this patent is extended or adjusted under 35 U.S.C. 154(b) by 604 days.

(21) Appl. No.: 11/083,781

(22) Filed: Mar. 18, 2005

(65) Prior Publication Data

US 2006/0211393 A1     Sep. 21, 2006

(51) Int. Cl.
*H04B 17/00*     (2006.01)

(52) U.S. Cl. .................. 455/67.11; 455/69; 455/76; 455/77; 375/376; 375/358; 375/373

(58) Field of Classification Search ............. 455/255, 455/258, 180.3, 182.1, 209, 260, 67.11, 69, 455/76, 77; 375/373, 374, 375, 376, 358
See application file for complete search history.

(56) References Cited

U.S. PATENT DOCUMENTS

| | | | | |
|---|---|---|---|---|
| 4,249,119 | A * | 2/1981 | Robbi | 388/811 |
| 6,545,547 | B2 * | 4/2003 | Fridi et al. | 331/16 |
| 6,597,249 | B2 * | 7/2003 | Chien et al. | 331/177 R |
| 2003/0048139 | A1 * | 3/2003 | Chien et al. | 331/11 |
| 2003/0171105 | A1 * | 9/2003 | Dunworth et al. | 455/258 |
| 2003/0224747 | A1 * | 12/2003 | Anand | 455/208 |
| 2004/0183576 | A1 * | 9/2004 | Kiyose et al. | 327/157 |
| 2005/0030072 | A1 * | 2/2005 | Keaveney | 327/156 |
| 2007/0057736 | A1 * | 3/2007 | Baird et al. | 331/16 |

* cited by examiner

*Primary Examiner*—Tuan A Pham
(74) *Attorney, Agent, or Firm*—McAndrews, Held & Malloy, Ltd.

(57) ABSTRACT

Methods and systems for calibrating a frequency of a circuit are disclosed herein and may comprise dividing a feedback frequency of an output frequency signal to generate a divided frequency signal. Open loop calibration may be performed based on a binary search of the generated divided frequency signal to generate a coarse calibrated frequency signal. Subsequently, a closed loop calibration may be performed on the coarse calibrated frequency signal to generate a fine calibrated frequency signal. A binary code may be generated utilizing the binary search of the generated divided frequency signal. Capacitance within the circuit may be adjusted based on the generated binary code. A control voltage for the circuit may be measured by closing a phase locked loop (PLL) with the circuit. If the measured control voltage is not within a determined voltage range, a calibration flag signal may be generated.

20 Claims, 9 Drawing Sheets

HIGH ACCURACY VOLTAGE CONTROLLED OSCILLATOR (VCO) CENTER FREQUENCY CALIBRATION CIRCUIT

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing signals. More specifically, certain embodiments of the invention relate to a method and system for high accuracy voltage controlled oscillator (VCO) center frequency calibration circuit.

BACKGROUND OF THE INVENTION

Modern communication devices, such as 802.x enabled communication devices, may utilize a conventional transceiver to transmit and/or receive signals with variable signal strength. One or more voltage controlled oscillator (VCO) circuits may be utilized within the conventional transceiver to generate oscillator reference signals with a specific output frequency and/or phase. The generated oscillator reference signals may then be utilized by a transmitter and/or by a receiver within the 802.x enabled device to facilitate processing of a received signal and/or processing of a signal prior to transmission.

The signal strength of a processed signal within a conventional transceiver varies depending on the distance between a transmitter and a receiver circuit, as well as environmental factors and process, temperature, etc. variations (PTV). A power amplifier may be utilized prior to signal transmission by a transmitter, for example, and a variable gain low noise amplifier may be utilized after a signal is received by a receiver, to amplify the signal and adjust the signal gain accordingly. In addition, reference signals generated by the voltage controlled oscillator circuits may also need to be calibrated due to variations caused by environmental factors and process, temperature, etc. variations.

The voltage controlled oscillator circuits within the conventional transceiver may be adapted to generate one or more differential frequency output signals and may be followed by one or more divider circuits, for example, that divide the generated differential frequency output signals for subsequent use by other circuits within the transceiver. The voltage controlled oscillators, however, are sensitive to loading from following divider circuits and/or other interconnections. Large capacitance from loading and/or resistance created by dividers and line routing decrease the quality factor and limit performance of the voltage controlled oscillator circuits within the transceiver.

In this regard, the desired output frequency of the differential output signal generated by the voltage controlled oscillator may change and re-calibration may be required. In addition, variations caused by environmental factors and PTV may result in deviations in the desired output frequency of the differential output signals generated the VCO circuits. Consequently, re-calibration of the voltage controlled oscillator may be required in order to generate output differential signals with desired output frequency. Calibration circuits, however, require significant on-chip real estate for handling additional re-calibration function. Further, conventional methods for calibrating the output frequency of the voltage controlled oscillator circuits may be time-consuming and/or inaccurate resulting in reduced overall processing efficiency of the transceiver.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for high accuracy voltage controlled oscillator (VCO) center frequency calibration, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for calibrating a frequency of a circuit. In an exemplary aspect of the invention, open loop calibration and closed loop calibration may be utilized to calibrate an output frequency of a voltage controlled oscillator. For example, a binary search may be utilized during open loop calibration to generate a binary code. The binary code may then be utilized by the voltage controlled oscillator to adjust capacitance of one or more capacitors in a switched capacitor array, for example, resulting in a coarse calibration and change of output frequency. Fine calibration of the VCO output frequency may be achieved during closed loop calibration, where for a specific output frequency, the control voltage of the VCO may be adjusted so that it is within a determined range.

In another aspect of the invention, a feedback frequency of an output frequency signal may be divided to generate a divided frequency signal. Open loop calibration may be performed based on a binary search of the generated divided frequency signal to generate a coarse calibrated frequency signal. Subsequently, a closed loop calibration may be performed on the coarse calibrated frequency signal to generate a fine calibrated frequency signal. A binary code may be generated utilizing the binary search of the generated divided frequency signal.

Capacitance within the circuit may be adjusted based on the generated binary code. A control voltage for the circuit may be measured by closing a phase locked loop (PLL) with the circuit. If the measured control voltage is not within a determined voltage range, a calibration flag signal may be generated. Capacitance within the circuit may be adjusted based on the generated calibration flag signal. The binary search may comprise a 9-bit binary search. A phase difference signal may be generated between a reference signal and a divided feedback frequency signal of the output frequency signal. A charge pulse may be generated utilizing the generated phase difference signal and the generated charge pulse may be stored prior to the closed loop calibration.

Figure 1:
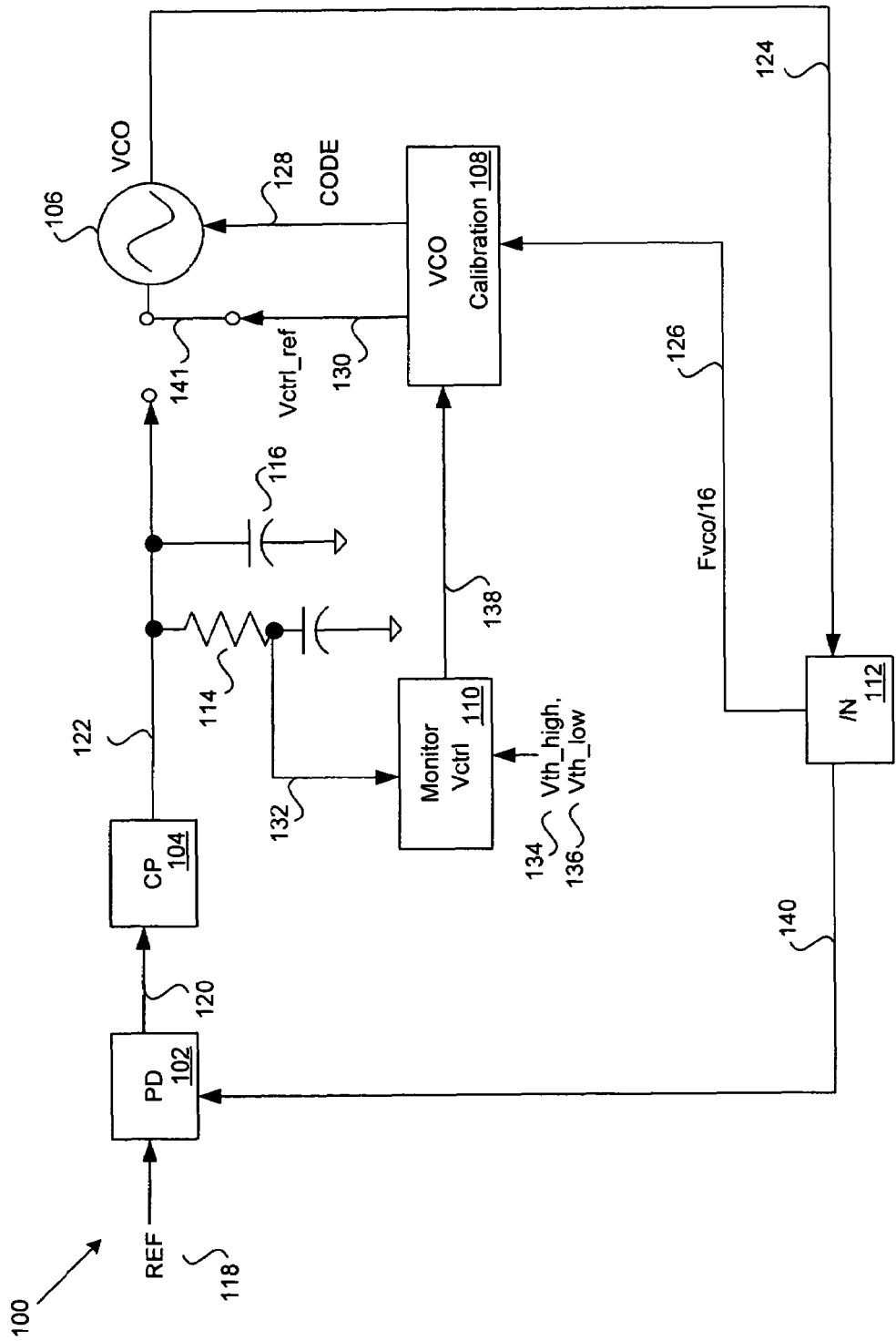
FIG. 1 is a block diagram illustrating a high accuracy voltage controlled oscillator (VCO) calibration circuit, in accordance with an embodiment of the invention.

FIG. 1 is a block diagram illustrating a high accuracy voltage controlled oscillator (VCO) calibration circuit, in accordance with an embodiment of the invention. Referring to FIG. 1, the high accuracy VCO calibration circuit 100 may comprise a phase/frequency detector (PD) 102, a charge pump (CP) 104, a filter 114, a grounded capacitor 116, a voltage controlled oscillator 106, a VCO calibration circuit 108, a control voltage monitoring circuit 110, and a divider 112.

The phase/frequency detector 102 may comprise suitable circuitry, logic, and/or code and may be adapted acquire a reference signal 118 and a divided VCO output signal 140 and to compare phase and/or frequency of the two acquired signals. The phase/frequency detector 102 may then output a signal 120 corresponding to a phase and/or frequency difference between the acquired reference signal 118 and the divided VCO output signal 140. For example, if the acquired reference signal 118 leads the divided VCO output signal 140, the output signal 120 may comprise duration between the rising of a rising edge of the reference signal 118 and the rising of a rising edge of the divided VCO output signal 140. Similarly, if the acquired reference signal 118 lags the divided VCO output signal 140, the output signal 120 may comprise duration between the rising of a rising edge of the divided VCO output signal 140 and the rising of a rising edge of the reference signal 118.

The charge pump 104 may comprise suitable circuitry, logic, and/or code and may be adapted to acquire a signal 120 generated by the phase/frequency detector 102 and generate a charge 122. The generated charge 122 may comprise a positive and/or a negative charge depending on whether the reference signal 118 leads or lags the divided VCO output signal 140. For example, if the reference signal 118 leads the divided VCO output signal 140, the charge pump 104 may generate a positive charge 122. Similarly, if the reference signal 118 lags the divided VCO output signal 140, the charge pump 104 may generate a negative charge 122. The charge 122 may be stored by the capacitor 116 and may be communicated to the VCO 106 during closed loop calibration when the control voltage arm 141 of the VCO 106 closes the circuit between the VCO 106 and the charge pump 104.

The voltage controlled oscillator 106 may comprise suitable circuitry, logic, and/or code and may be adapted to generate a differential output signal 124 with a determined output frequency. The voltage controlled oscillator 106 may comprise a pair of differential switched capacitor arrays, for example, which may be utilized to change capacitance of the VCO 106, thereby changing the resonance frequency of the output signal 124.

The VCO calibration circuit 108 may comprise suitable circuitry, logic, and/or code and may be adapted to perform coarse and/or fine calibration of the output frequency of the VCO output signal 124. In one aspect of the invention, during open loop calibration, or coarse calibration, the VCO calibration circuit 108 may be adapted to perform a binary search and generate a binary code 128 for adjusting capacitance within the voltage controlled oscillator 106. For example, the VCO calibration circuit 108 may be adapted to perform a 9-bit binary search to generate the binary code 128. The binary code 128 may be utilized by the VCO 106 to turn ON one or more switched capacitors in a differential switched capacitor array within the VCO 106. During open loop calibration, the control voltage of the VCO 106 may be set to a reference voltage $V_{ctrl\_ref}$ by connecting the control voltage arm 141 of the VCO 106 with the reference voltage output 130 of the VCO calibration circuit 108.

Even though a 9-bit binary search is utilized by the VCO calibration circuit 108 during open loop calibration, the present invention may not be so limited. Other types of binary searches may also be performed with resulting binary codes comprising a different number of bits.

The VCO calibration circuit 108 may also be adapted to acquire a calibration signal 138 generated by the control voltage monitoring circuit 110. The calibration signal 138 may be utilized by the VCO calibration circuit 108 during a closed loop calibration, or fine calibration, of the VCO output signal 124. In this regard, during closed loop calibration, the VCO calibration circuit 108 may generate a binary code 128 for adjusting capacitance within the VCO 106 at small incremental steps. By adjusting capacitance within the VCO 106 at small incremental steps, the control voltage of the VCO 106 may be adjusted so that it is within a determined threshold interval.

The control voltage monitoring circuit 110 may comprise suitable circuitry, logic, and/or code and may be utilized to generate a calibration signal 138 during closed loop calibration of the VCO 106. During closed loop calibration, the control voltage arm 141 of the VCO 106 may close the connection between the VCO 106 and the charge pump 104, thereby closing the phase locked loop (PLL) comprising the phase/frequency detector 102, the charge pump 104, the VCO 106 and the divider 112. After the PLL is closed, the control voltage 132 within the PLL may be measured after a resistor drop within the filter 114.

The control voltage monitoring circuit 110 may be adapted to compare the control voltage 132 with control voltage threshold values $V_{th\_high}$ 134 and $V_{th\_low}$ 136. If the control voltage 132 is not within a range of the control voltage threshold values $V_{th\_high}$ 134 and $V_{th\_low}$ 136, the control voltage monitor circuit 110 may generate the calibration signal 138. The calibration circuit 138 may then be utilized by the VCO calibration circuit 108 to adjust the control voltage 132 so that it is within a range determined by the control voltage threshold values $V_{th\_high}$ 134 and $V_{th\_low}$ 136.

The divider 112 may comprise suitable circuitry, logic, and/or code and may be adapted to divide the VCO output signal 124. For example, the VCO output signal 124 may be divided by 16 to generate a divided signal 126. The divided signal 126 may be utilized by the VCO calibration circuit 108 during closed loop calibration. For example, the VCO calibration circuit 108 may determine the output frequency of the divided signal 126 during a binary search so that a corresponding binary code may be generated for calibration of the output frequency of the VCO output signal 124. Further, the divider 112 may generate a divided signal 140, which may be compared with the reference signal 118 within the phase/frequency detector 102.

In operation, during an exemplary open loop calibration cycle, the control voltage of the VCO 106 may be set to a reference voltage $V_{ctrl\_ref}$ by connecting the control voltage arm 141 of the VCO 106 with the reference voltage output 130 of the VCO calibration circuit 108. The VCO output signal 124 may be divided by the divider circuit 112 to generate a divided VCO signal 126.

In one aspect of the invention, the VCO output signal 124 may be divided by 16 to generate the divided VCO signal 126. However, the present invention may not be so limited and other divide-by factors may be utilized by the divider circuit 112.

The divided VCO signal 126 may then be communicated to the VCO calibration circuit 108. The VCO calibration circuit 108 may utilize the divided VCO signal 126 to determine the output frequency of the VCO output signal 124. The determined output frequency of the VCO output signal 124 may be utilized during a binary search for generating a binary code 128. The generated binary code 128 may be communicated to the VCO 106 and may be utilized to adjust capacitance of one or more switched capacitors within the VCO 106. For example, the VCO 106 may turn ON and/or OFF one or more capacitors within a differential switched capacitor array based on the received binary code 128. The VCO calibration circuit 108 may continue to generate binary codes 128 for the entire duration of the binary search and until the output frequency of the VCO output signal 124 is close to a desired output frequency.

In operation, during an exemplary closed loop calibration cycle, the control voltage arm 141 of the VCO 106 may close the connection between the VCO 106 and the charge pump 104, thereby closing the phase locked loop (PLL) comprising the phase/frequency detector 102, the charge pump 104, the VCO 106 and the divider 112. After the PLL is closed, the phase/frequency detector 102 may determine a phase and/or frequency difference between the reference signal 118 and the VCO divided signal 140. The charge pump 104 may then generate one or more charge signals 122. The charge signals 122 may be stored by the capacitor 116 and may be utilized by the VCO 106 to change its control voltage. After the frequency of the VCO output signal 124 is adjusted so that it is the same as the frequency of the reference signal 118, the control voltage 132 within the PLL may be measured after a resistor drop within the filter 114.

The control voltage 132 may be communicated to the control voltage monitoring circuit 110. In one aspect of the invention, the control voltage monitoring circuit 110 may comprise a pair of comparators which may be adapted to compare the control voltage 132 with the control voltage threshold values $V_{th\_high}$ 134 and $V_{th\_low}$ 136. If the control voltage 132 is not between a range determined by the control voltage threshold values $V_{th\_high}$ 134 and $V_{th\_low}$ 136, the control voltage monitoring circuit 110 may generate a calibration signal 138. In this regard, in response to the calibration signal 138, the VCO calibration circuit 108 may generate a binary code 128 for adjusting capacitance within the VCO 106 at small incremental steps. By adjusting capacitance within the VCO 106 at small incremental steps, the control voltage 132 of the VCO 106 may be adjusted so that it is within a threshold interval determined by the control voltage threshold values $V_{th\_high}$ 134 and $V_{th\_low}$ 136.

Figure 2:
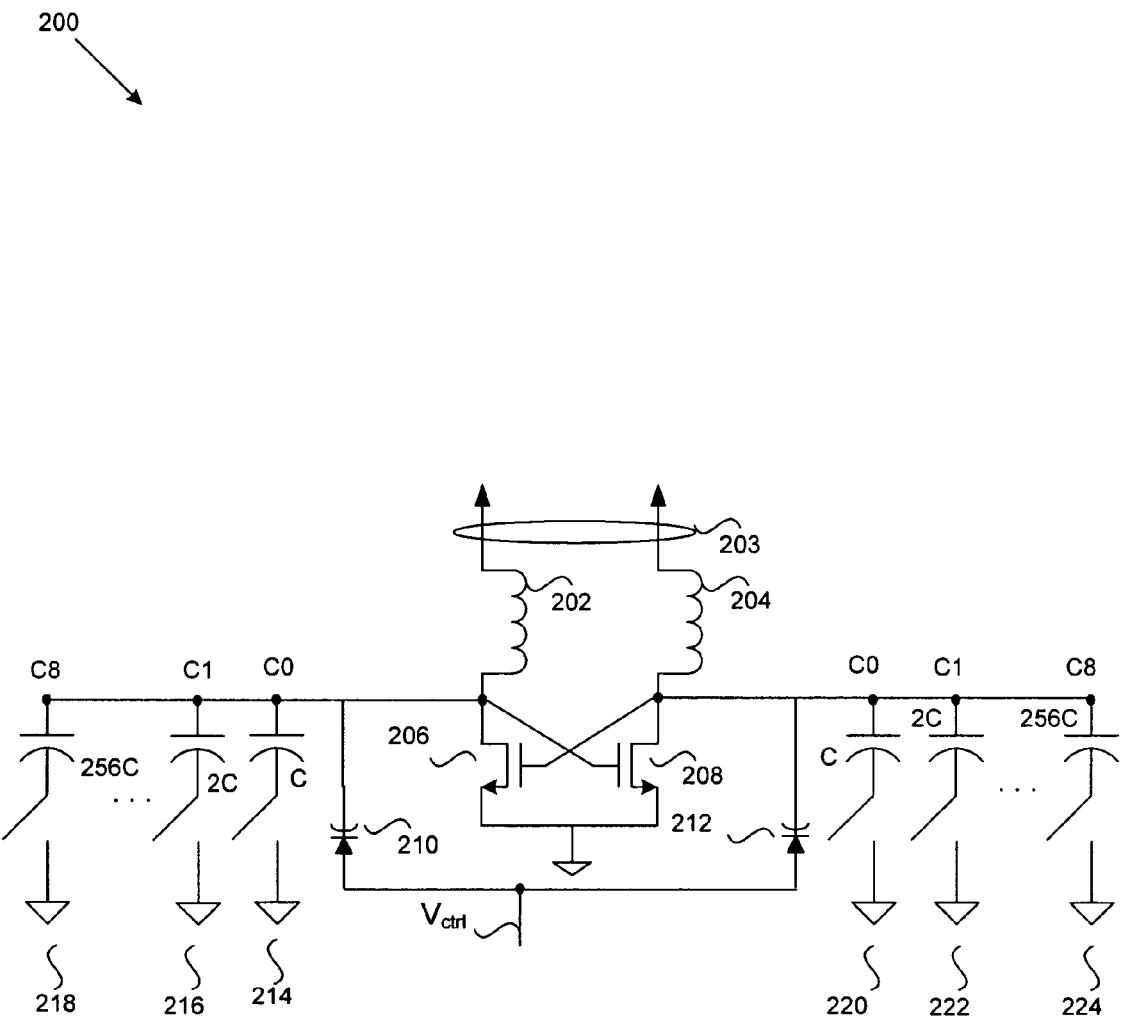
FIG. 2 is a circuit illustrating an exemplary voltage controlled oscillator (VCO) circuit that may be utilized in accordance with an embodiment of the invention.

FIG. 2 is a circuit illustrating an exemplary voltage controlled oscillator (VCO) circuit that may be utilized in accordance with an embodiment of the invention. Referring to FIG. 2, the exemplary voltage controlled oscillator circuit 200 may comprise inductors 202 and 204, NMOS transistors 206 and 208, varactors 210 and 212, and differential switched capacitor arrays comprising switched capacitors 214, . . . , 218 and 220, . . . , 224.

Each of the switched capacitors 214, . . . , 218 and 220, . . . , 224 may be characterized with capacitance of a multiple of an exemplary capacitance C. For example, switched capacitor C0 214 may be characterized with capacitance C, switched capacitor C1 216 may be characterized with capacitance 2C, and switched capacitor C8 218 may be characterized with capacitance 256C. Similarly, switched capacitors C0 220 may be characterized with capacitance C, switched capacitor C1 222 may be characterized with capacitance 2C, and switched capacitor C8 224 may be characterized with capacitance 256C.

In operation, the voltage control oscillator circuit 200 may generate differential output signals 203 at the output terminals of inductors 202 and 204. The generated differential output signals 203 may be characterized by output frequency $f_{out}$. The output frequency $f_{out}$ of the differential output signals 203 may be changed during calibration of the voltage control oscillator circuit 200. In one aspect of the invention, the output frequency $f_{out}$ of the differential output signals 203 may be adjusted by adjusting the control voltage $V_{ctrl}$. A change in the control voltage $V_{ctrl}$ may result in a change of the capacitance of the varactors 210 and 212. However, a change in the capacitance of the varactors 210 and 212 may be limited.

In another aspect of the invention, the output frequency $f_{out}$ of the differential output signals 203 may be adjusted by changing capacitance of one or more switched capacitors within the switched differential arrays comprising capacitors 214, . . . , 218 and 220, . . . , 224. For example, one or more of the differential switched capacitors C0, . . . , C8 may be switched ON or OFF, resulting in a change of the total capacitance of the voltage control oscillator circuit 200. Consequently, the output frequency $f_{out}$ of the differential output signals 203 may be adjusted.

Figure 3:
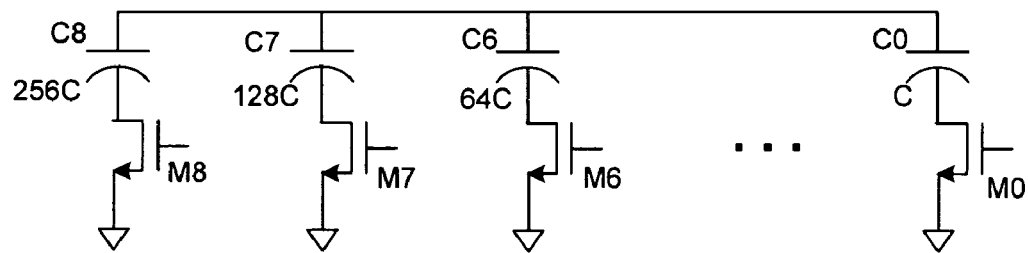
FIG. 3 is a circuit illustrating an exemplary binary weighted capacitor array that may be utilized in accordance with an embodiment of the invention.

FIG. 3 is a circuit illustrating an exemplary binary weighted capacitor array that may be utilized in accordance with an embodiment of the invention. Referring to FIG. 3, the exemplary binary weighted capacitor array 300 may be implemented in an electric signal processing device, such as a voltage controlled oscillator (VCO), for example, that may utilize differential switched capacitor tuning over a broad range of frequencies. For example, a VCO may utilize the binary weighted capacitor array 300 in an 802.x enabled transceiver during generation of a differential oscillator signal.

In one embodiment of the invention, the binary weighted capacitor array 300 may comprise a 9-bit switched capacitor array and may be a part of one or more LC-tanks within a VCO, for example. In this regard, the binary weighted capacitor array 300 may comprise switched capacitors C0 through C8 with corresponding transistors M0 through M8. Each of the legs in the 9-bit switched capacitor array may comprise a switched capacitor and a switching transistor and each leg may be coupled in parallel.

In one aspect of the invention, each of the switched capacitors Cn within the 9-bit binary weighted capacitor array 300 may be selected with capacitance that is a $2^n$ multiple of a capacitance unit "C." Single capacitor C9 may be selected with capacitance at (256*C), for example. Capacitor C0 may be selected with capacitance ($2^0$*C), which equals C. Similarly, capacitor C6 may be selected with capacitance ($2^6$*C), which equals (64*C). The seventh capacitor C7 may then be selected with capacitance (128*C). In this manner, the total capacitance of capacitors C0 through C8 may equal (511*C).

Switching transistors M0 through M8 may comprise NMOS transistors, for example, and may be adapted to selectively switch each corresponding capacitor C0 through C8 ON or OFF. By utilizing switched capacitor tuning, the binary weighted capacitor array 300 may be adapted to selectively change the total capacitance of the LC-tank and achieve a broad tuning frequency range.

In an exemplary aspect of the invention, a voltage controlled oscillator, such as the VCO 106 in FIG. 1, may comprise a differential switched capacitor array 300. Total capacitance within the VCO may be adjusted by selectively turning ON and/or OFF one or more of the switched capacitors C0 through C8 within the switched capacitor array 300. For example, a 9-bit binary code may be utilized to switch one or more of the capacitors C0, . . . , C8 ON or OFF. The 9-bit binary code may be determined during a binary search, for example, and as part of an open loop calibration cycle. In this regard, depending on the 9-bit binary code, a total capacitance between 0 and 511C may be selected for the voltage controlled oscillator.

Even though the switched capacitor array 300 utilizes nine switched capacitors, the present invention may not be so limited. Switched capacitor arrays with more or less than nine capacitors may also be utilized. A corresponding binary code with the same number of bits as the number of capacitors may be utilized in order to determine a total capacitance within the voltage controlled oscillator.

Figure 4:
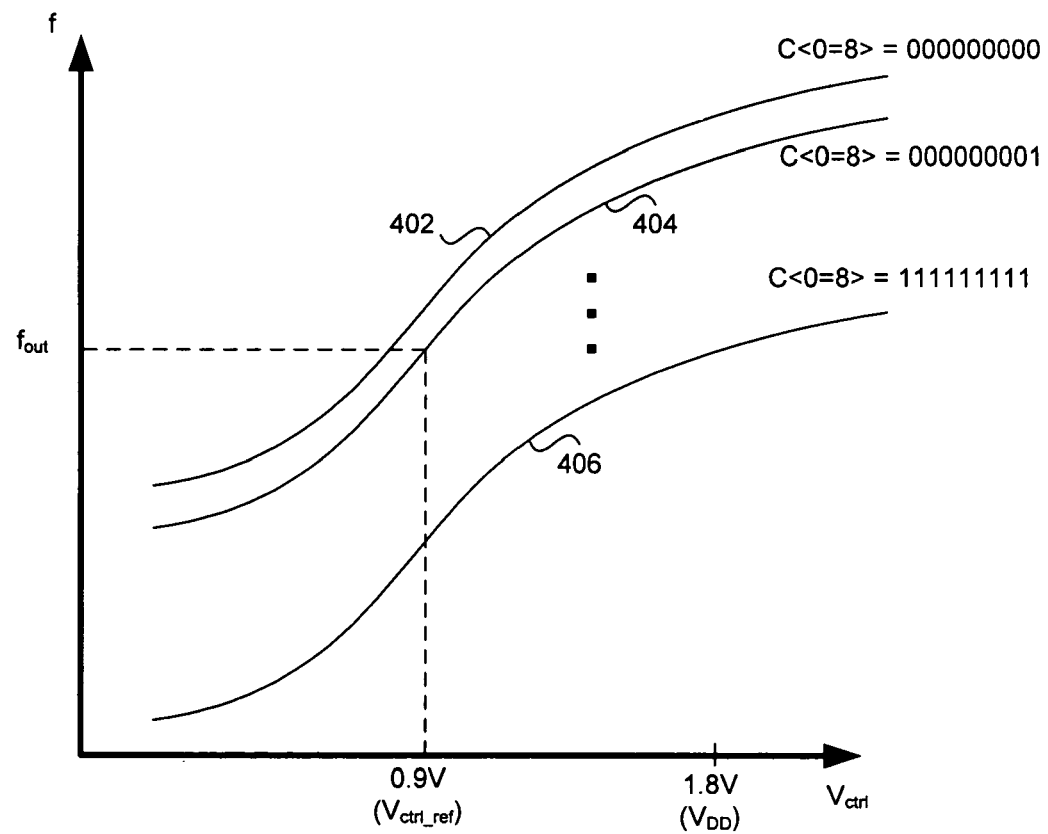
FIG. 4 is a graphical depiction illustrating exemplary voltage controlled oscillator (VCO) tuning curves, in accordance with an embodiment of the invention.

FIG. 4 is a graphical depiction illustrating exemplary voltage controlled oscillator (VCO) tuning curves, in accordance with an embodiment of the invention. Referring to FIG. 4, the graphical representation 400 may illustrate a plurality of voltage control oscillator tuning curves 402, . . . , 406 for an exemplary voltage control oscillator. Each of the VCO tuning curves 402, . . . , 406 may correspond to a specific capacitance of the exemplary VCO, which may be determined utilizing a binary code. The binary code may be selected during a binary search in an open loop calibration. For example, VCO tuning curve 402 may correspond to total capacitance of the VCO determined by the binary code 000000000.

In one aspect of the invention a binary code of 0 may result in a switched capacitor being turned OFF and a binary code of 1 may result in a switched capacitor being turned ON. A binary code 000000000, therefore, may result in all nine switched capacitors in a switched capacitor array being turned OFF. Similarly, a binary code of 000000001, corresponding to VCO tuning curve 404, may result in only one switched capacitor being turned ON, and a binary code of 111111111, corresponding to VCO tuning curve 406, may result in all switched capacitors being turned ON.

In operation, during an exemplary open loop calibration cycle, a binary code may be selected so that, for a given reference control voltage, a desired output frequency $f_{out}$ may be achieved in an output signal generated by a voltage controlled oscillator utilizing a binary switched capacitor array, such as the VCO 106 in FIG. 1. For example, a reference control voltage for a VCO, or $V_{ctrl\_ref}$, may be set at approximately one half of the supply voltage $V_{DD}$. If $V_{DD}$ is set at 1.8V, then the reference control voltage, $V_{ctrl\_ref}$, may be set at approximately 0.9V, as illustrated in FIG. 4. During a binary search, for a specific the reference control voltage, $V_{ctrl\_ref}$, a binary code may be selected such that an output frequency of the VCO is approximately equal to a desired output frequency $f_{out}$. Consequently, VCO tuning curve 404 may be selected with corresponding binary code 000000001. The VCO tuning curves 402, . . . , 406 may correspond to a plurality of binary codes covering total VCO capacitance of 0 through 511C, for a 9-bit switched capacitor array and a 9-bit binary search.

Figure 5:
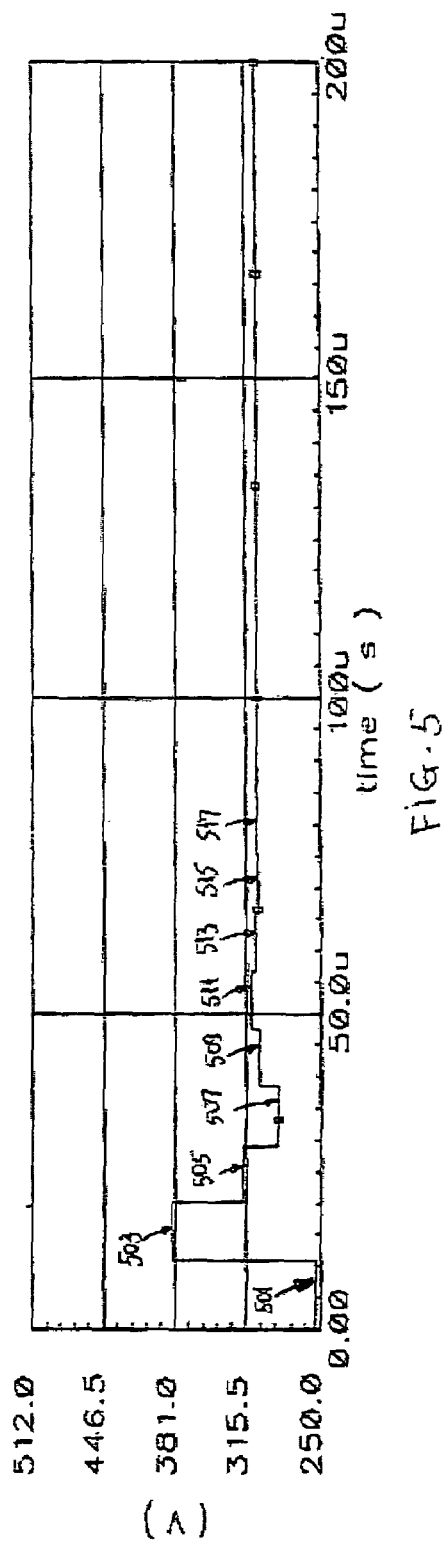
FIG. 5 is a graph illustrating binary search during open loop calibration, in accordance with an embodiment of the invention.

FIG. 5 is a graph illustrating binary search during open loop calibration, in accordance with an embodiment of the invention. Referring to FIG. 5, the exemplary open loop calibration cycle may start by selecting a binary code corresponding to one half, for example, of the total capacitance in a binary switched capacitor array. At position 501, therefore, for a 9-bit binary search cycle, a total capacitance of 256C may be selected. Since output frequency is higher than the desired frequency, the next capacitor value 128C may be subsequently selected and added to the previous capacitance. Therefore, at position 503, a total capacitance of 256C+128C, or 384C, may be selected with a corresponding binary code.

Similarly, at position 505, since the output frequency may be lower than the desired frequency, the subsequent capacitor value 64C may be subtracted resulting in a total capacitance of 320C. At position 507, since the output frequency may still be lower than the desired frequency, the subsequent capacitor value 32C may be subtracted resulting in a total capacitance of 288C. At position 509, since the output frequency may be higher than the desired frequency, the subsequent capacitor value 16C may be added resulting in a total capacitance of 304C. At position 511, since the output frequency may still be higher than the desired frequency, the subsequent capacitor value 8C may be added resulting in a total capacitance of 312C.

At position 513, since the output frequency may be lower than the desired frequency, the subsequent capacitor value 4C may be subtracted resulting in a total capacitance of 308C. At position 515, since the output frequency may still be lower than the desired frequency, the subsequent capacitor value 2C may be subtracted resulting in a total capacitance of 306C. At position 515, since the output frequency may be higher than the desired frequency, the subsequent capacitor value C may be added resulting in a total capacitance of 307C. The binary search may then conclude and a final binary code may be generated, based on the final capacitance determined after all switched capacitors have been considered. The fine calibration may then be achieved during closed loop calibration by adjusting the control voltage of a VCO.

Figure 6:
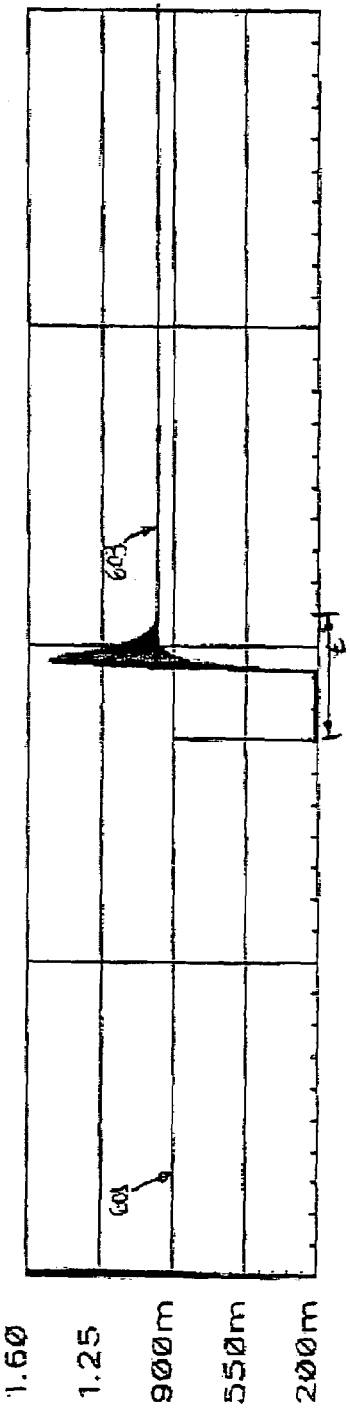
FIG. 6 is a graph illustrating change in control voltage after closing of a phase locked loop, in accordance with an embodiment of the invention.

FIG. 6 is a graph illustrating change in control voltage after closing of a phase locked loop, in accordance with an embodiment of the invention. Referring to FIGS. 1 and 6, prior to closing a phase locked loop, such as the phase locked loop as referred to with regard to FIG. 1, the control voltage of a VCO may be set to reference level $V_{ctrl\_ref}$. For example, the reference control voltage, $V_{ctrl\_ref}$, may be set to 900 mV, as illustrated by graph line 601. After an open loop calibration, the phase locked loop may be closed so that a frequency of the reference signal 118 may equal a frequency of the divided VCO signal 140. In this regard, during time t, the VCO control voltage $V_{ctrl}$ may change and may subsequently settle at a value slightly above 900 mV, as represented by graph line 603.

Figure 7:
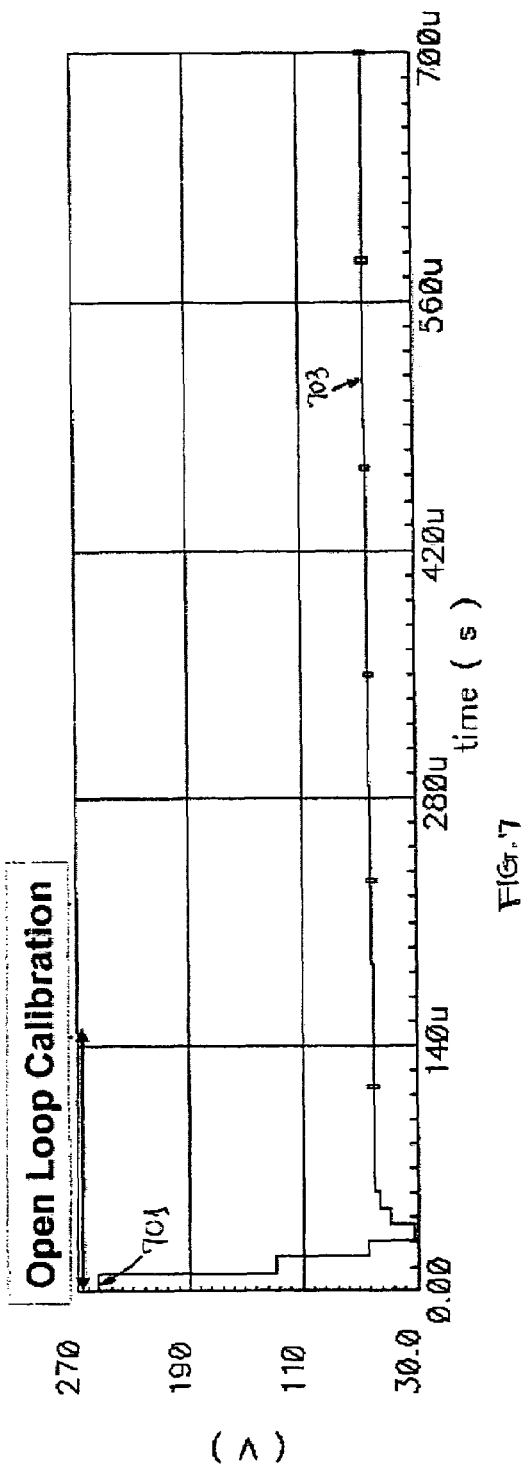
FIG. 7 is a graph illustrating the change of binary code during open loop calibration followed by closed loop calibration, in accordance with an embodiment of the invention.

FIG. 7 is a graph illustrating the change of binary code during open loop calibration followed by closed loop calibration, in accordance with an embodiment of the invention. Referring to FIG. 7, during an exemplary open loop calibration cycle, capacitance within an exemplary VCO may be changed by switching ON or OFF one or more switched capacitors within switched capacitor array in the VCO. The capacitance may be initially selected at position 701 and after consideration of all switched capacitors within the switched capacitor array, final capacitance may be determined at position 703. In this regard, open loop calibration may last approximately 140 microseconds, as reflected in FIG. 7. The open loop calibration may conclude with generation of a binary code based on the final capacitance value at position 703.

Figure 8:
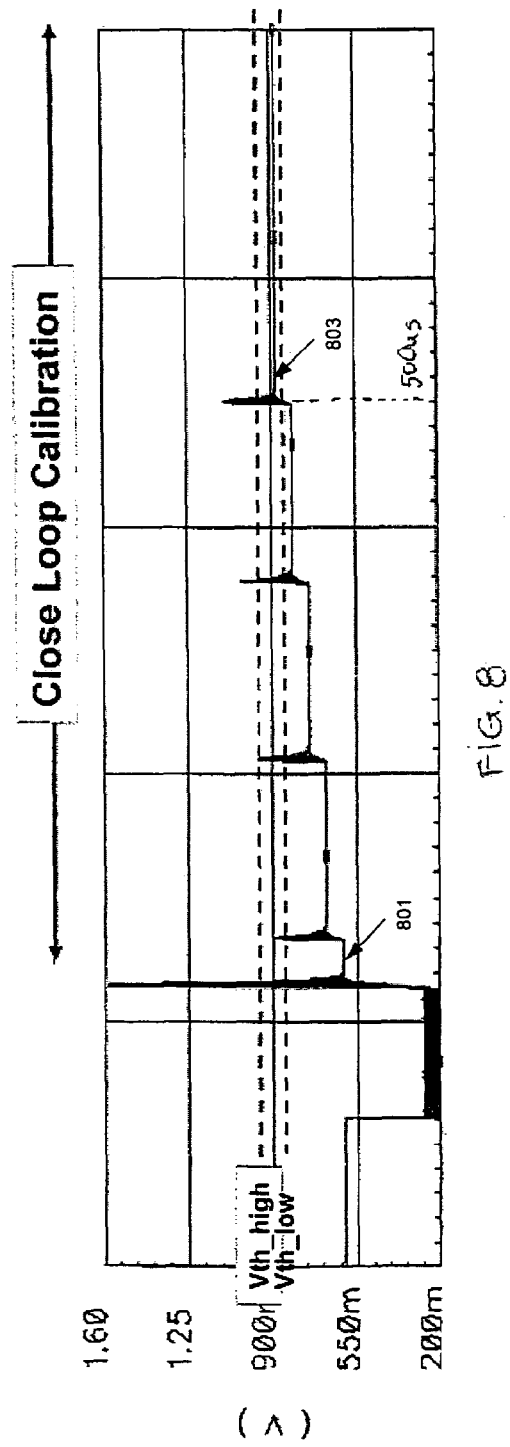
FIG. 8 is a graph illustrating change in VCO control voltage during open loop calibration followed by closed loop calibration utilizing high and low control voltage thresholds, in accordance with an embodiment of the invention.

FIG. 8 is a graph illustrating change in VCO control voltage during open loop calibration followed by closed loop calibration utilizing high and low control voltage thresholds, in accordance with an embodiment of the invention. Referring to FIG. 8, open loop calibration may occur between 0 and 150 µs, and closed loop calibration may occur between 150 µs and 500 µs, for example. Referring to FIGS. 1 and 8, after a phase locked loop is closed, as explained with regard to the phase locked loop in FIG. 1, the control voltage, $V_{ctrl}$, may settle at about 550 mV, as illustrated by the graph line at position 801. However, the control voltage at position 801 is outside the threshold range determined by the control voltage threshold values $V_{th\_high}$ 134 and $V_{th\_low}$ 136.

The control voltage monitoring circuit 110 may then generate a calibration signal 138 and in response to the calibration signal 138, the VCO calibration circuit 108 may generate a binary code 128 for adjusting capacitance within the VCO 106 at small incremental steps. By adjusting capacitance within the VCO 106 at small incremental steps, the control voltage 132 of the VCO 106 may be adjusted so that, at position 803, it is within the threshold interval determined by the control voltage threshold values $V_{th\_high}$ 134 and $V_{th\_low}$ 136.

Figure 9:
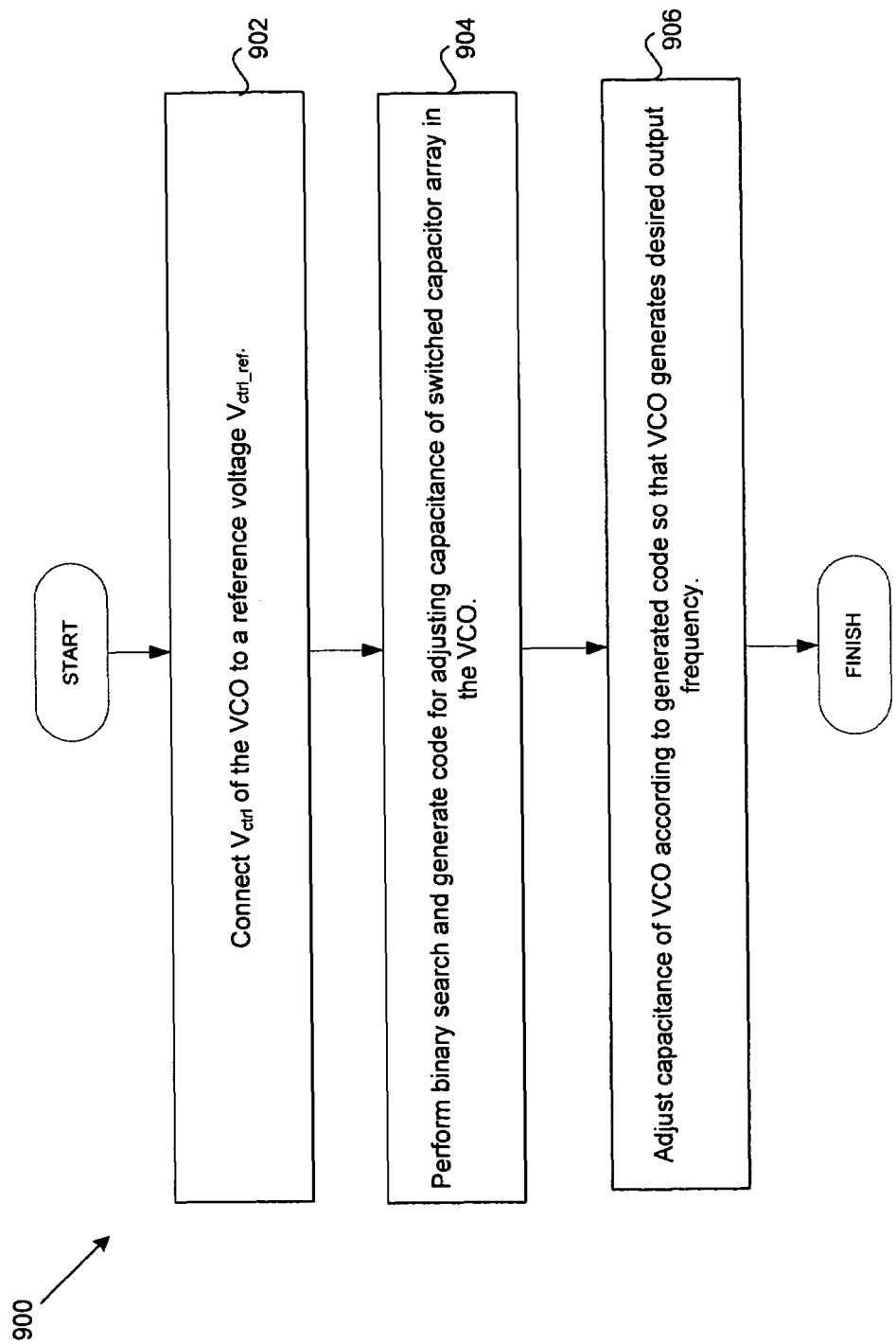
FIG. 9 is a flow diagram illustrating exemplary steps for open loop calibration, in accordance with an embodiment of the invention.

FIG. 9 is a flow diagram 900 illustrating exemplary steps for open loop calibration, in accordance with an embodiment of the invention. Referring to FIG. 9, at 902, the control voltage $V_{ctrl}$ of a voltage controlled oscillator may be connected to a reference voltage $V_{ctrl\_ref}$. At 904, a binary search may be performed and a binary code may be generated for adjusting capacitance within a switched capacitor array in the VCO. At 906, capacitance of the VCO may be adjusted according to the generated binary code so that the VCO may generate a desired output frequency.

Figure 10:
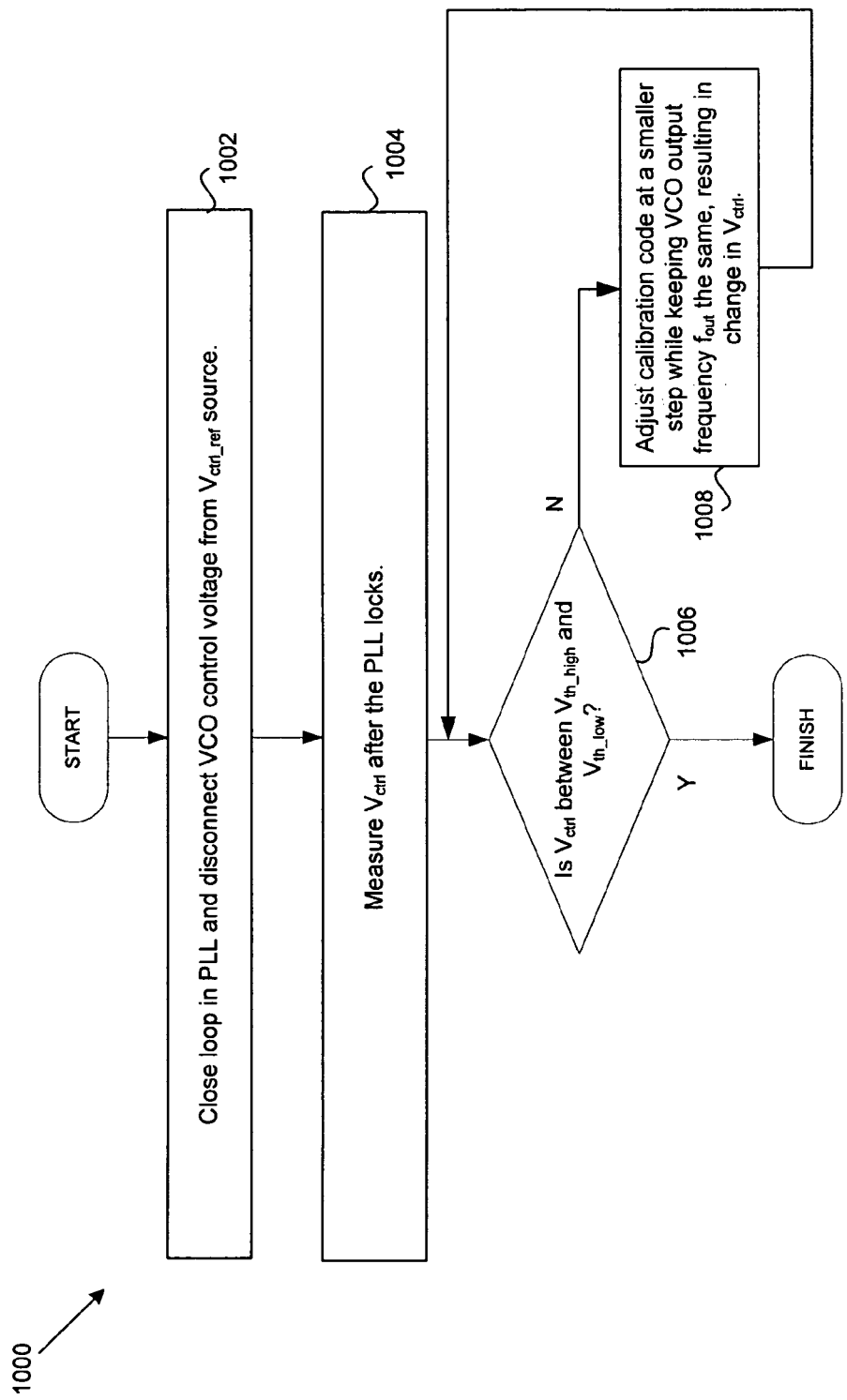
FIG. 10 is a flow diagram illustrating exemplary steps for closed loop calibration, in accordance with an embodiment of the invention.

FIG. 10 is a flow diagram 1000 illustrating exemplary steps for closed loop calibration, in accordance with an embodiment of the invention. Referring to FIG. 10, at 1002, a phase locked loop may be closed by disconnecting the VCO control voltage supply from the reference control voltage $V_{ctrl\_ref}$ source. At 1004, after the PLL locks, the control voltage $V_{ctrl}$ may be measured. At 1006, it may be determined whether the control voltage $V_{ctrl}$ is in a threshold range determined by $V_{th\_high}$ and $V_{th\_low}$ threshold voltages. If the control voltage $V_{ctrl}$ is not in the threshold range determined by $V_{th\_high}$ and $V_{th\_low}$ threshold voltages, at 1008, during an exemplary closed loop calibration cycle, a calibration code generated by a control voltage monitoring circuit may be adjusted at a determined small step, resulting in a change in the control voltage $V_{ctrl}$ and fine calibration of the output frequency $f_{out}$. The exemplary steps may then be looped back to 1006 until it may be determined that the control voltage $V_{ctrl}$ is in a threshold range determined by $V_{th\_high}$ and $V_{th\_low}$ threshold voltages. After it may be determined that the control voltage $V_{ctrl}$ is in a threshold range determined by $V_{th\_high}$ and $V_{th\_low}$ threshold voltages, the exemplary steps may end.

Figure 11:
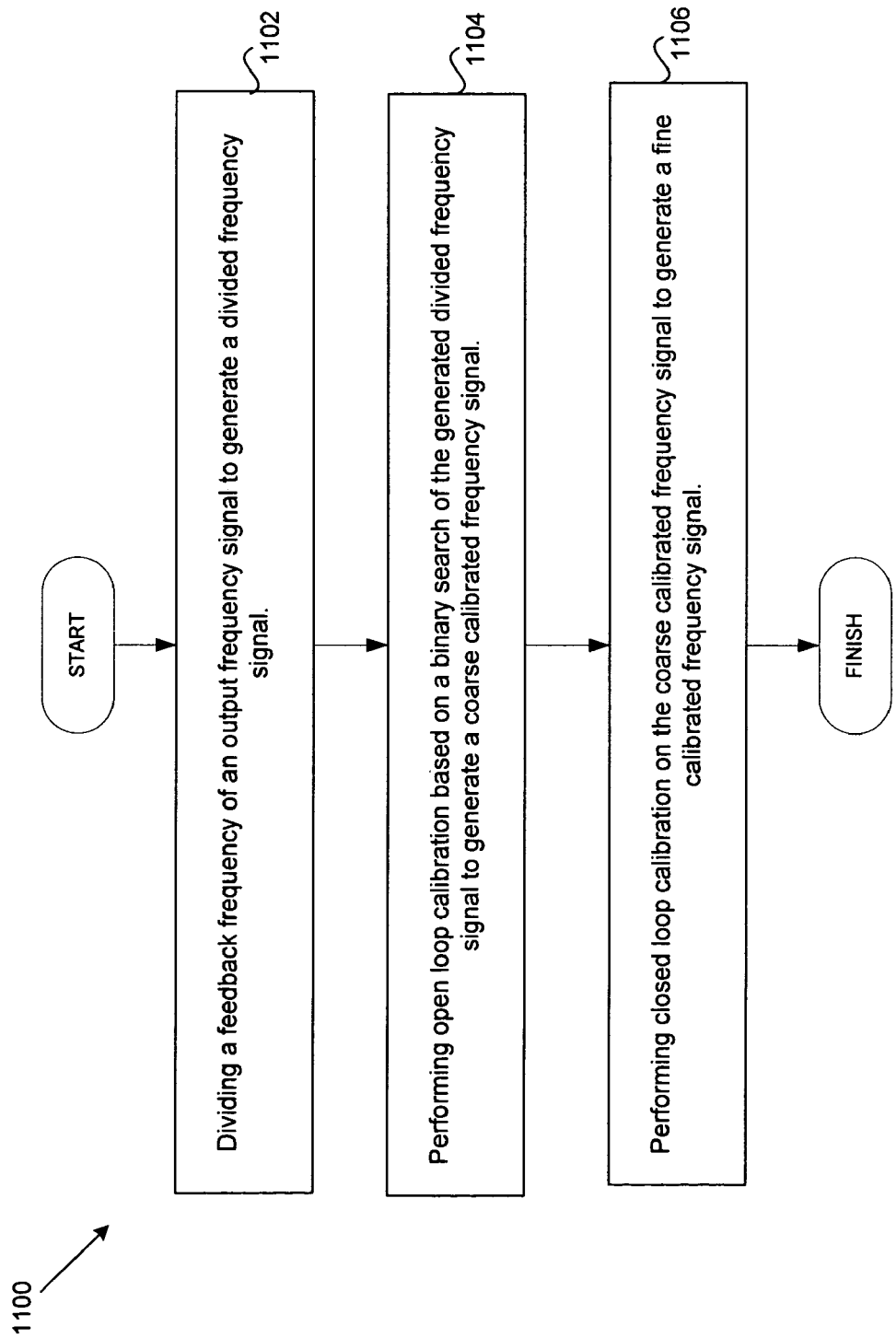
FIG. 11 is a flow diagram illustrating exemplary steps for calibrating a frequency in a circuit, in accordance with an embodiment of the invention.

FIG. 11 is a flow diagram 100 illustrating exemplary steps for calibrating a frequency in a circuit, in accordance with an embodiment of the invention. Referring to FIG. 11, at 1102, a feedback frequency of an output frequency signal may be divided to generate a divided frequency signal. At 1104, open loop calibration may be performed, based on a binary search of the generated divided frequency signal to generate a coarse calibrated frequency signal. At 1106, closed loop calibration may be performed on the coarse calibrated frequency signal to generate a fine calibrated frequency signal.

Referring again to FIG. 1, in an exemplary aspect of the invention, the divider circuit 112 may be utilized to divide a feedback frequency of an output frequency signal 124 to generate a divided frequency signal 126. The VCO calibration circuit 108 may be adapted to perform open loop calibration based on a binary search of the divided frequency signal 126 to generate a coarse calibrated frequency signal. The VCO calibration circuit 108 may also be adapted to perform closed loop calibration on the coarse calibrated frequency signal to generate a fine calibrated frequency signal. The VCO calibration circuit 108 may generate at least one binary code utilizing the binary search of the divided frequency signal 126. The VCO 106 may comprise circuitry that adjusts capacitance within the VCO 106 based on the generated binary code.

The voltage control monitoring circuit 110 may be adapted to measure a control voltage for the circuit 100 by closing a phase locked loop (PLL) with the circuit 100. If the measured control voltage is not within a determined voltage range, the voltage control monitoring circuit 110 may generate a calibration flag signal. The VCO calibration circuit 108 may be adapted to adjust capacitance within the VCO 106 based on the generated calibration flag signal. The binary search may comprise a 9-bit binary search. The phase/frequency detector 102 may generate a phase difference signal between a reference signal 118 and a divided feedback frequency signal 140 of the output frequency signal 124. The charge pump circuit 104 may generate at least one charge pulse utilizing the generated phase difference signal 120. The capacitor 116 may be utilized to store the generated charge pulse prior to the closed loop calibration of the VCO 106.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for calibrating a frequency of a circuit, the method comprising:
   dividing a feedback frequency of an output frequency signal to generate a divided frequency signal;
   performing open loop calibration of a voltage controlled oscillator (VCO) in a phase locked loop (PLL) based on a binary search of said generated divided frequency signal to generate a coarse calibrated frequency signal and a resulting binary code; and
   performing closed loop calibration on said coarse calibrated frequency signal based on said generated binary code to generate a fine calibrated frequency signal, wherein a control voltage for said VCO is configured within a desired range by incrementing said binary code by one or more integer values.

2. The method according to claim 1, comprising configuring a reference control voltage for said VCO utilizing said binary search of said generated divided frequency signal.

3. The method according to claim 2, comprising adjusting capacitance within said VCO based on said reference control voltage.

4. The method according to claim 1, comprising comparing said control voltage for said VCO to said desired range by closing said PLL.

5. The method according to claim 4, comprising, if said measured control voltage is not within said desired voltage range, generating a calibration flag signal.

6. The method according to claim 5, comprising adjusting capacitance within said VCO based on said generated calibration flag signal.

7. The method according to claim 1, wherein said binary search comprises a 9-bit binary search.

8. The method according to claim 1, comprising generating a phase difference signal between a reference signal and a divided feedback frequency signal of said output frequency signal.

9. The method according to claim 8, comprising generating at least one charge pulse utilizing said generated phase difference signal.

10. The method according to claim 9, comprising storing said generated charge pulse prior to said closed loop calibration.

11. A system for calibrating a frequency of a circuit, the system comprising:
    a divider circuit that divides a feedback frequency of an output frequency signal to generate a divided frequency signal;
    a calibration circuit that performs open loop calibration of a voltage controlled oscillator (VCO) in a phase locked loop based on a binary search of said generated divided frequency signal to generate a coarse calibrated frequency signal and a resulting binary code; and
    said calibration circuit performs closed loop calibration on said coarse calibrated frequency signal based on said generated binary code to generate a fine calibrated frequency signal, wherein a control voltage for said VCO is configured within a desired range by incrementing said binary code by one or more integer values.

12. The system according to claim 11, wherein said calibration circuit configuring a reference control voltage for said VCO utilizing said binary search of said generated divided frequency signal.

13. The system according to claim 12, comprising circuitry that adjusts capacitance within said VCO based on said reference control voltage.

14. The system according to claim 11, comprising measuring circuitry that compares said control voltage for said VCO to said desired range by closing said PLL.

15. The system according to claim 14, wherein, if said measured control voltage is not within said desired voltage range, said measuring circuitry generates a calibration flag signal.

16. The system according to claim 15, comprising circuitry that adjusts capacitance within said VCO based on said generated calibration flag signal.

17. The system according to claim 11, wherein said binary search comprises a 9-bit binary search.

18. The system according to claim 11, comprising a phase frequency detector that generates a phase difference signal between a reference signal and a divided feedback frequency signal of said output frequency signal.

19. The system according to claim 18, comprising a charge pump circuit that generates at least one charge pulse utilizing said generated phase difference signal.

20. The system according to claim 19, comprising circuitry that stores said generated charge pulse prior to said closed loop calibration.

* * * * *

UNITED STATES PATENT AND TRADEMARK OFFICE
CERTIFICATE OF CORRECTION

PATENT NO.        : 7,590,387 B2                              Page 1 of 1
APPLICATION NO.   : 11/083781
DATED             : September 15, 2009
INVENTOR(S)       : Hung-Ming Chien It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1150 days.

Signed and Sealed this

Twenty-first Day of September, 2010

David J. Kappos
*Director of the United States Patent and Trademark Office*